(12) United States Patent
Ohodnicki et al.

(10) Patent No.: US 11,899,080 B2
(45) Date of Patent: Feb. 13, 2024

(54) OPTICAL SENSING OF MAGNETIC FIELDS USING MAGNETICALLY SENSITIVE MATERIALS

(71) Applicant: United States Department of Energy, Washington, DC (US)

(72) Inventors: Paul Ohodnicki, Pittsburgh, PA (US); Derek Lau, San Jose, CA (US); Jagannath Devkota, Pittsburgh, PA (US); Michael McHenry, Pittsburgh, PA (US); Alex Leary, Pittsburgh, PA (US); Richard Beddingfield, Raleigh, NC (US); Michael Buric, Morgantown, WV (US)

(73) Assignee: United States Department of Energy, Washington, DC (US)

( * ) Notice: Subject to any disclaimer, the term of this patent is extended or adjusted under 35 U.S.C. 154(b) by 132 days.

(21) Appl. No.: 17/379,389

(22) Filed: Jul. 19, 2021

(65) Prior Publication Data
US 2022/0003826 A1 Jan. 6, 2022

Related U.S. Application Data

(63) Continuation-in-part of application No. 16/123,786, filed on Sep. 6, 2018, now Pat. No. 11,067,458.

(60) Provisional application No. 62/606,160, filed on Sep. 6, 2017, provisional application No. 62/606,015, filed on Sep. 6, 2017.

(51) Int. Cl.
*G01R 33/032* (2006.01)

(52) U.S. Cl.
CPC ................... *G01R 33/032* (2013.01)

(58) Field of Classification Search
None
See application file for complete search history.

(56) References Cited

U.S. PATENT DOCUMENTS

| | | | |
|---|---|---|---|
| 5,356,220 A | 10/1994 | Lida et al. | |
| 5,469,265 A * | 11/1995 | Measures | G01D 5/35383 250/226 |
| 6,811,307 B2 | 11/2004 | Crowe et al. | |
| 7,154,081 B1 | 12/2006 | Friedersdorf et al. | |
| 8,636,408 B2 | 1/2014 | Kasajima et al. | |
| 9,274,181 B1 * | 3/2016 | Carman | G01R 33/032 |
| 2015/0300891 A1 | 10/2015 | Mitchell et al. | |
| 2018/0058956 A1 | 3/2018 | Molin et al. | |

* cited by examiner

*Primary Examiner* — Edwin C Gunberg
(74) *Attorney, Agent, or Firm* — Aaron R. Keith; Michael J. Dobbs

(57) ABSTRACT

The invention provides a method for measuring the magnetic field of an electromagnetic component having the steps of: instrumenting one or more portions of an electromagnetic component by placing an optical fiber in electromagnetic communication with the one or more portions of said electromagnetic component; energizing the electromagnetic component; interrogating the optical fiber using light and an optical detector; and determining changes in the magnetic field incident on the optical fiber based on the detected changes in the light received by the optical detector.

25 Claims, 15 Drawing Sheets

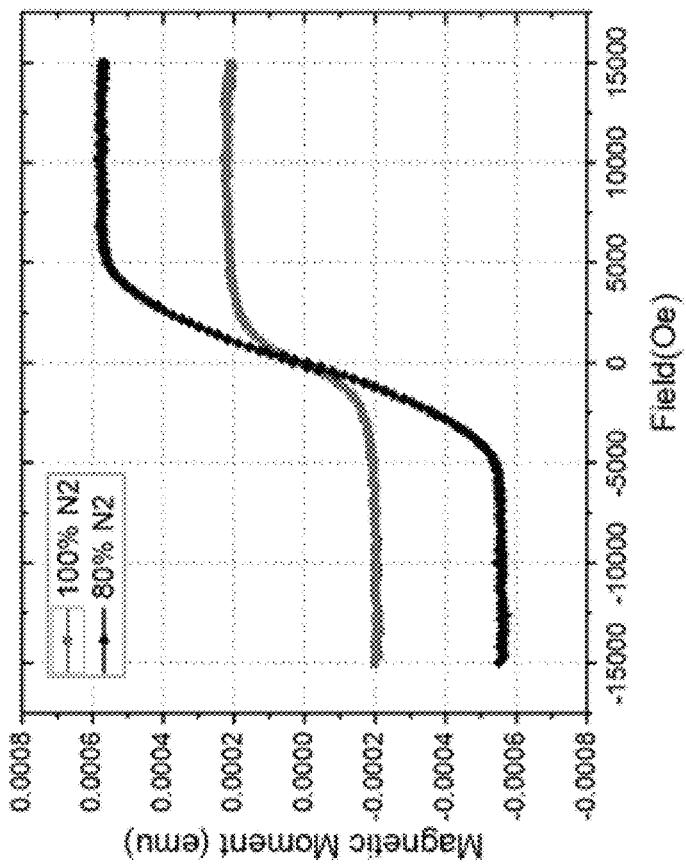
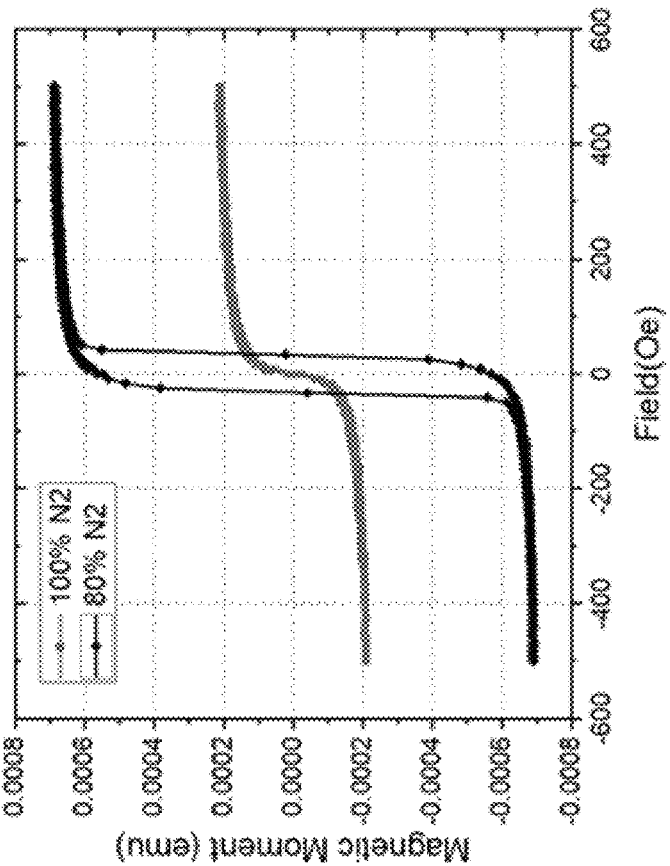
FIG. 13B
FIG. 13A

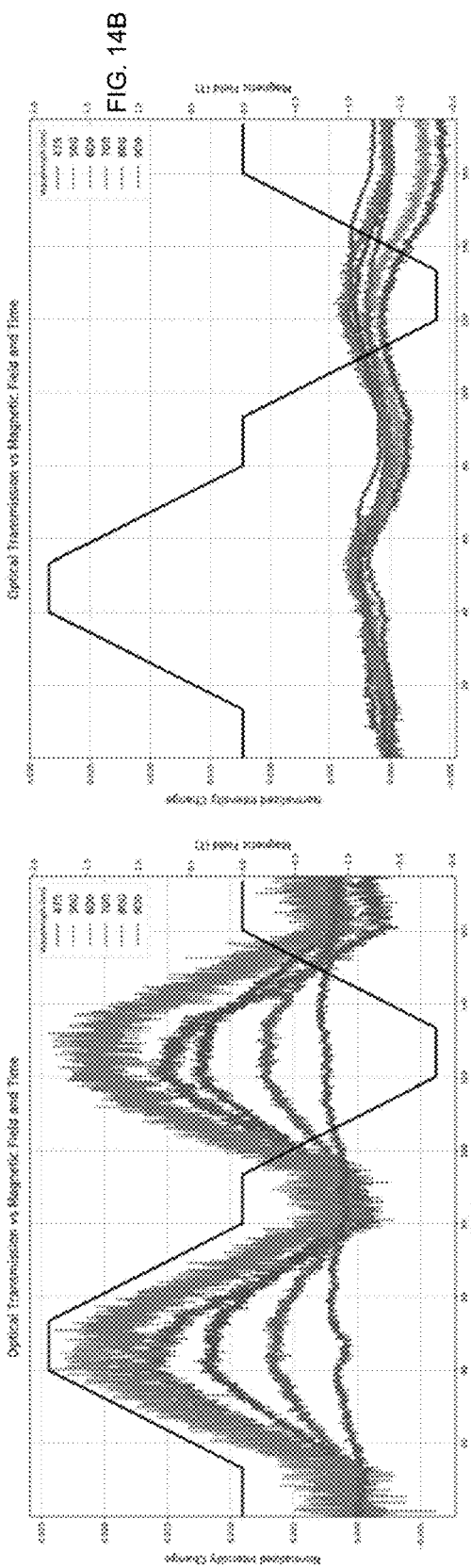
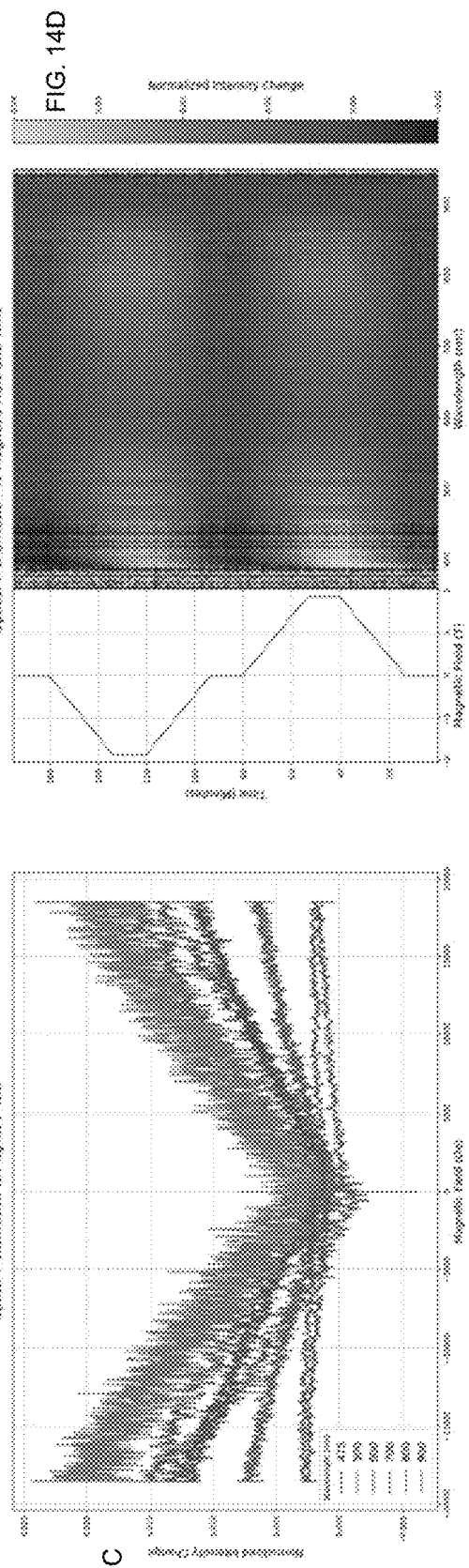
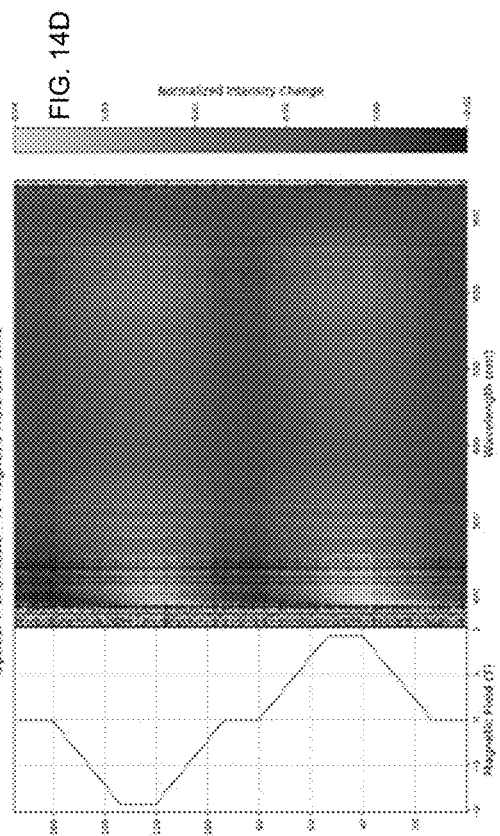
FIG. 14A
FIG. 14B
FIG. 14C
FIG. 14D

OPTICAL SENSING OF MAGNETIC FIELDS USING MAGNETICALLY SENSITIVE MATERIALS

RELATED APPLICATIONS

This application claims priority benefit as a continuation-in-part of U.S. Non-Provisional patent application Ser. No. 16/123,786, filed Sep. 6, 2018, currently pending, which in turn claims the benefit of U.S. Provisional Application No. 62/606,160, filed Sep. 6, 2017, currently expired, and U.S. Provisional Application No. 62/606,015, filed Sep. 6, 2017, currently expired, the contents of each hereby incorporated by reference.

GOVERNMENT INTEREST

This invention was made with government support under DOE No. DE-EE0007464 and DE-FG02-16CH99999 awarded by the Department of Energy. The government has certain rights in the invention.

BACKGROUND OF THE INVENTION

Monitoring of temperatures and other critical parameters for operational power magnetics components is problematic due to a combination of high voltages and currents, electromagnetic interference, elevated temperatures and insulation oils/gases, and the potential for electrical based sensing methodologies to interfere with the operation of the energized component. Thermal management of passive components such as inductors and capacitors Is a key challenge for successful power conversion at high efficiency and reliability, as the emergence of new SIC- and GaN-based wide bandgap semiconductor devices enables higher temperature and frequency operation to achieve new and unprecedented power densities. In addition, large power transformers are critical grid assets for which catastrophic failures can have major social and economic impacts. Internal component monitoring of key parameters Including temperature, gas phase or Insulation oil chemistry, acoustic emissions, electric, and magnetic fields can allow for identification of faults prior to catastrophic failures and can save significant time and resources by enabling condition-based maintenance programs.

Power transformers are a critical electrical grid asset for which catastrophic failures can represent significant direct economic, opportunity, and even safety costs. Due to a high degree of customization, dominance of foreign owned power transformer manufacturers, and anticipated lifetimes of greater than 30 years for large power transformers, there is a major need for improved instrumentation of transformer lifetime to enable real-time diagnostics of transformer operational conditions which are signatures of potential fault conditions prior to the initiation of catastrophic failures.

Traditionally, magnetic field sensors such as hall sensors and magnetometers have been produced for many applications including a range of industries, energy infrastructures, and robotics. However, conventional current based sensor technology is limited by complicated electrical design, cost to mass produce, and their inability to be deployed in harsh environments. Sensors built on optical fiber platforms have re-emerged as a promising application to fill niches in the sensing applications that are unfulfilled. Specifically, fiber optic magnetic field sensors promise portability, passive sensing, remote sensing, distributed sensing, high sensitivity, immunity to electromagnetic interference, and functionality in harsh environments.

To date, there have been several approaches to develop an optical fiber sensor for magnetic fields, each with their flaws. Optical fibers can be coated with a magnetostrictive material to sense magnetic fields based on how the magnetostrictive material deforms. This implementation is relatively straightforward but is limited by its relatively low sensitivity and expensive optical instrumentation or the requirement of in-fiber devices (e.g. Fiber Bragg Gratings) to measure strains. Sensors have also been developed to detect magnetic fields based on rotation of polarized light as it travels through the fiber but are limited by complexity of the device and are largely incompatible with distributed sensing schemes. An approach of using magnetic ferrofluids to track changes in magnetic field has also been devised, but this approach is also limited by complicated fabrication considerations.

A need in the art exists for an alternative to magnetic field sensors of the prior art.

SUMMARY OF THE INVENTION

The invention describes a technology for which internal temperature within a power transformer can be measured in real time as a function of time and spatial position throughout the component. For example, the sensor can be applied to the insulation oil, the outer casing, and even directly to the electrical windings and magnetic core during high power and high voltage operation or embedded within the laminations of a magnetic core to determine internal core temperatures, information which cannot be obtained in any other way using standard temperature measurement tools and techniques. The sensor element is comprised of low-cost, commercially available materials and is combined with advanced interrogation and sensor application methodologies. The same sensing technology can also be applied to other power magnetics components including inductors and rotating electrical machinery such as motors. The sensor platform can also be extended to other parameters of interest including chemistry of insulation oils or gases, magnetic fields, and voltages through functionalization with selected thin film materials systems.

The dimensions of the compact transformer create a challenge for conventional sensing methods to access with only discrete measurement points at selected locations being possible, if at all, with conventional technologies. Because distributed interrogation methods combined with optical sensing fibers have the advantages of small size and high flexibility, it is possible to install the sensing fiber distributed over the whole core structures without affecting the precise effective temperature readings or negatively impacting the operation of the magnetic core structure. Additionally, the dynamic temperature rising process can be effectively monitored by the optical fiber sensor which provides valuable time dependent information in conjunction with spatially distributed information.

Rayleigh backscatter in optical fiber is caused by random fluctuations in the refractive index profile along the fiber length, and it varies randomly along the fiber length due to inhomogeneity of the fiber. Changes in the refractive index profile caused by an external stimulus such as temperature will induce a spectral shift in the measured signal derived from a cross-correlation of the backscattered intensity under two different measurement conditions which can be measured by an optical frequency-domain reflectometer (OFDR)

system. A high-sensitivity, high-resolution OFDR system can be used to measure distributed temperature rise of a compact transformer core.

The invention also describes a technology that uses a coating of magnetically sensitive material on an optical fiber to measure changes in magnetic field incident on said coating. Surprisingly and unexpectedly, the inventors have discovered that an embodiment of the invention described herein using said magnetically sensitive material as a coating on an optical fiber allows for simple optical measurement of magnetic field incident on the coating through simple optical measurement using a simple transmission based detector. While the embodiment of the invention using a magnetically sensitive material is suitable for use with simple optical methods, the embodiment is compatible with the distributed sensing methods and Rayleigh backscattering methods described herein.

BRIEF DESCRIPTION OF THE DRAWINGS

FIGS. 13A and 13B show graphs of magnetization of a thin film of LSMO versus field responses with FIG. 13A showing an external magnetic field applied parallel to film surface, demonstrating easy axis, and FIG. 13B showing an external magnetic field applied perpendicular to film surface, demonstrating hard axis.

FIGS. 14A-14D show graphs of the time resolved optical transmission response of a LSMO film for various applied field values from H=0T to H=+1.75T and H=−1.75T (in-plane), at various optical wavelengths including $\lambda$=475, 500, 600, 700, 800, and 900 nm, with FIG. 14A using a 150 nm thick LSMO film and FIG. 14B using a 50 nm thick LSMO film. FIG. 14C shows a graph of example optical transmission measurements as a function of applied field for the same wavelengths clearly showing a monotonic increase in transmission with increased applied field. FIG. 14D presents the magnetic field sensing results of FIG. 14A in the form of a two-dimensional plot showing the optical transmission response (intensity) as a function of magnetic field varying over time (vertical) and wavelength (horizontal axis).

DETAILED DESCRIPTION

Figure 1:
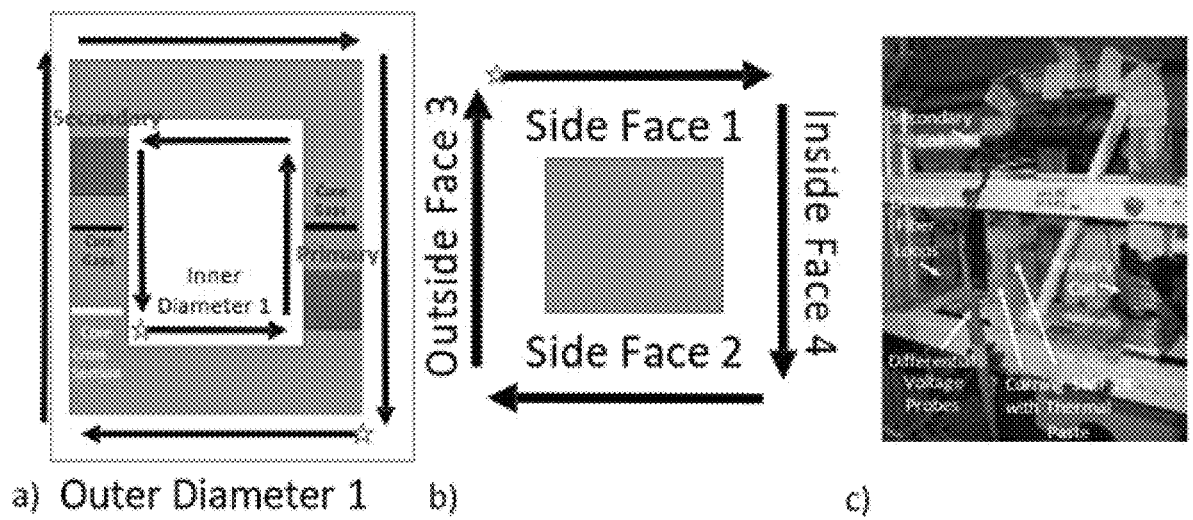
FIG. 1 shows a schematic of instrumented fibers along the core of the transformer in various configurations.

Optical backscattering-based reflectometry techniques such as optical time domain (OTDR) and optical frequency domain reflectometry (OFDR) enable the distributed Interrogation of physical parameters such as temperature and strain along the length of low-cost, commercial optical fibers with millimeter to centimeter resolution depending upon the detailed interrogation system. The current invention is comprised of the application of optical fiber-based sensors to power magnetics components including transformers, inductors, and rotating electrical machinery such as motors and generators. More specifically, the 2d and 3d temperature profiles throughout the component, including along the surface and within the interior of a magnetic component such as a magnetic core, can be mapped by maintaining thermal contact of an optical fiber along the component. Similarly, the strain distribution can also be obtained through maintaining mechanical contact. Through functionalization of the optical fiber platform with thin or thick film sensing materials, the platform can also be functionalized for sensing other parameters of interest for asset monitoring in such components including, for example, magnetic field, electric field, and gas phase/insulation oil chemistry thereby allowing for spatially resolved measurements of these important parameters.

As one example, for fiber-optics sensing based distributed temperature measurement of a single-phase two-winding transformer, the technique is applied to a core comprised of a FINEMET-type ribbon approximately 50.8 mm wide and 20 μm thick. The ribbon is wound into a toroid core and then formed into a racetrack shape using a steel fixture. After forming a tape wound core from the nanocrystalline ribbon, the assembly (material and steel fixture) is annealed at 540° C. for 3 hours in air. Finally, the core is impregnated with an epoxy resin to provide strength and shape retention. To lessen the impact of fringing flux and other imperfections, the core is left uncut. Each core section has a 3 mm OD nylon served Type 2 Litz wire four-turn winding, insulated with Nomex® and Kapton tape. Wire terminations are made with a ring terminal by crimping and dip soldering. The core is attached to a custom extruded aluminum frame to allow for minimal impacts from strain. The constructed transformer is subjected to an open secondary test using a custom developed H-bridge based bipolar excitation circuit to evaluate its core losses and thermal field distribution when excited with waveforms on the primary winding that are relevant for deployment in medium frequency power electronics and power conversion applications.

The custom excitation circuit employs SiC-based semiconductor JFET devices and is rated for excitation voltages approaching 800V with a DC power supply rated for up to 15 kW. When considering the high anticipated efficiencies of transformer cores, which are typically targeted at 98% or greater, the system can in principle allow for excitations that are relevant for cores utilized in power converter applications at 50-100 kW or even greater. For the purpose of demonstration of the application of optical fiber distributed sensor technology to transformer monitoring in this work, described herein is a setup using a small prototype transformer core at low to moderate excitation conditions with sufficient losses to result in measurable temperature profiles that can be detected and quantified. Similar methodologies can be applied to larger magnetic cores under higher power excitation conditions and the results can be compared with thermal models to allow for new tools to optimize the design of advanced magnetic core technologies for a range of power electronics and transformer applications.

In one embodiment, a magnetic core testing system comprises a magnetic core test fixture; an H-bridge based switching circuit for arbitrary waveform excitation; a DC power supply up to 1500V and 30A; and primary coils for exciting the core along with an open secondary for core response measurement.

The FINEMET-based magnetic core described above was used to show the viability of the method. A LUNA optical backscatter interferometry (OFDR) system was used in conjunction with Corning SMF28 single mode-based optical fiber to perform the distributed temperature measurement under core excitation of a 100V, S0 kHz square wave with a 50% duty cycle. The instrumented optical fibers are placed in contact with the core using a thermal paste.

Three primary paths along the core were instrumented using the optical fiber to gain information about the temperature gradient along the outside of the core cross section as well as the inner diameter and outer diameter of the overall core. FIG. 1 shows a schematic of the three paths, illustrated by the black arrows in FIGS. 1(a) and 1(b), along with an image of the instrumented core in FIG. 1(c). These paths were chosen due to their importance and relevance during actual core operation including heat transfer of losses from the core interior to the surface and the surrounding environment as well as the spatial variation in the flux density distribution throughout the magnetic core resulting in a spatial variation in losses and associated temperature rise. FIG. 1(a) shows a schematic of a magnetic core showing primary and secondary coils, the core gaps, and the three instrumented paths of the fiber optic sensor including the inner diameter, outer diameter, and core cross section. FIG. 1(b) shows a cross section of the core illustrated in more detail showing the four faces of the core that were instrumented. The instrumented fiber begins at the "starred" region for each instrumented path and follows the ordered number with fiber loops at the sharp corners. Preferably, strain relief loops were placed on each corner of the core to ensure that there is no significant strain on the fiber during operation to minimize cross-talk between strain and temperature.

Figure 2:
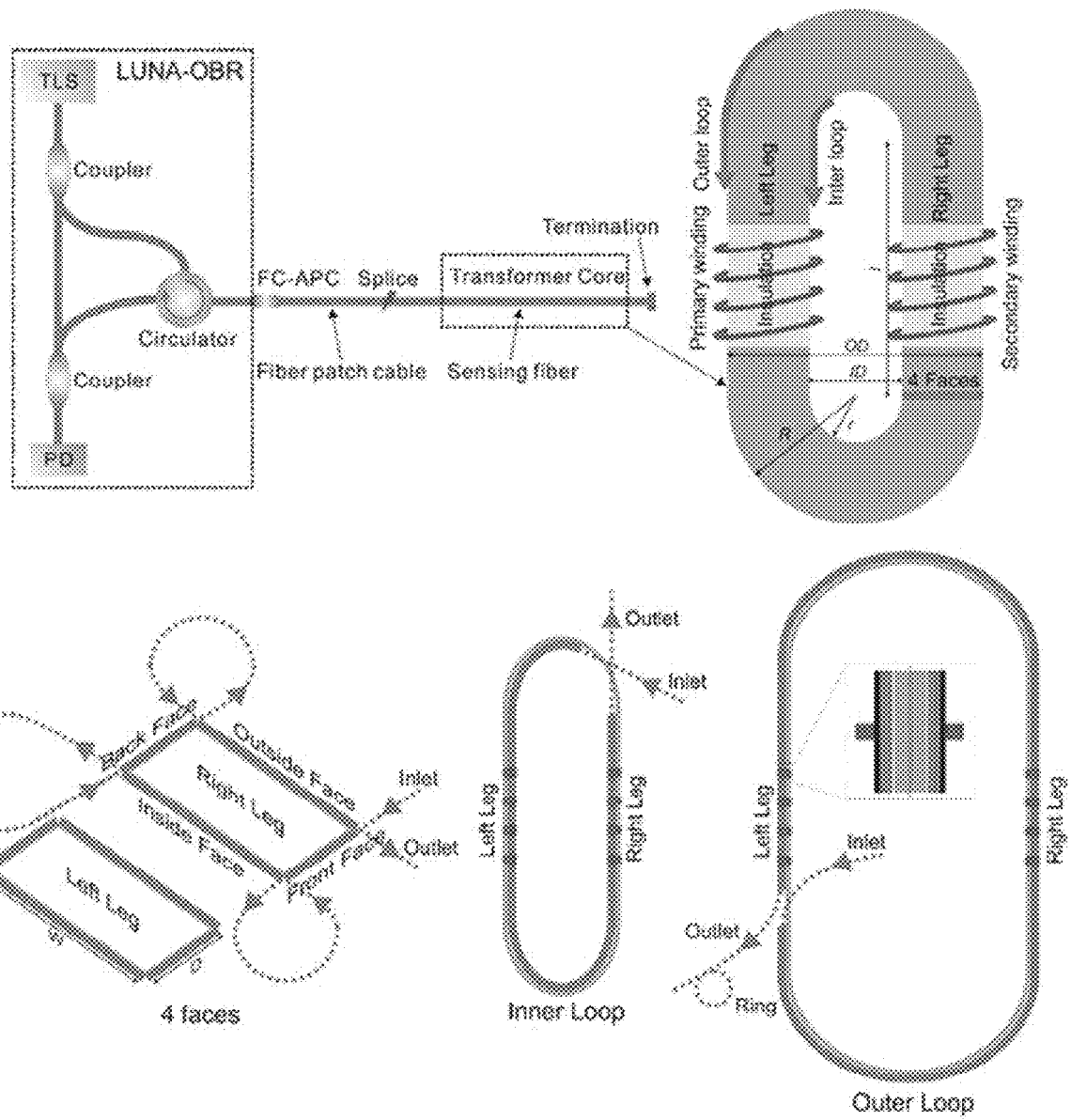
FIG. 2 is a schematic diagram of the configuration of the OFTD our system showing the design of the optical path of the instrumented optical fiber.

FIG. 2 illustrates a schematic diagram of the configuration of the OFDR system, the physical structure of the transformer core, and the design of the optical path. The OFDR system consists of a wavelength tunable laser source (TLS), a main interferometer, photodetectors (PD) and a sensing data acquisition and processing system. The sensing fiber is a 5 m long commercial SMF28 single-mode fiber fusion spliced with a single-mode fiber patch cable terminated with a FC/APC connector, and the rear end of the sensing fiber was coiled into a fiber ring of a very small diameter to prevent end-face Fresnel reflection. The sensing fiber is successively mounted on the four faces (front, inside, back left leg, back right leg, and outside), inner loop, and outer loop of the racetrack-core transformer which is defined by its inner and outer diameters, inner and outer radius, straight leg length, thickness and width.

In OFDR, a fast Fourier transform is performed to obtain the power spectrum of reflected light at different Rayleigh scattering points by converting the data from frequency-domain to time-domain. To realize distributed measurement of temperature, a reference trace is required for relative phase change measurement under two temperature conditions at each location along the fiber under test. Segments of the Rayleigh backscatter pattern at the same positions are extracted from both the reference and the measurement profiles and then transformed back to frequency-domain by using inverse fast Fourier transform. A Rayleigh backscattering spectrum as a function of spectral shift can be obtained accordingly. Thus, the cross-correlation between the Rayleigh backscatter spectra of the reference and measurement segments presents a spectral shift which is proportional to the changes in temperature. Distributed temperature sensing can be finally achieved by calibrating the spectral shifts.

Figure 3:
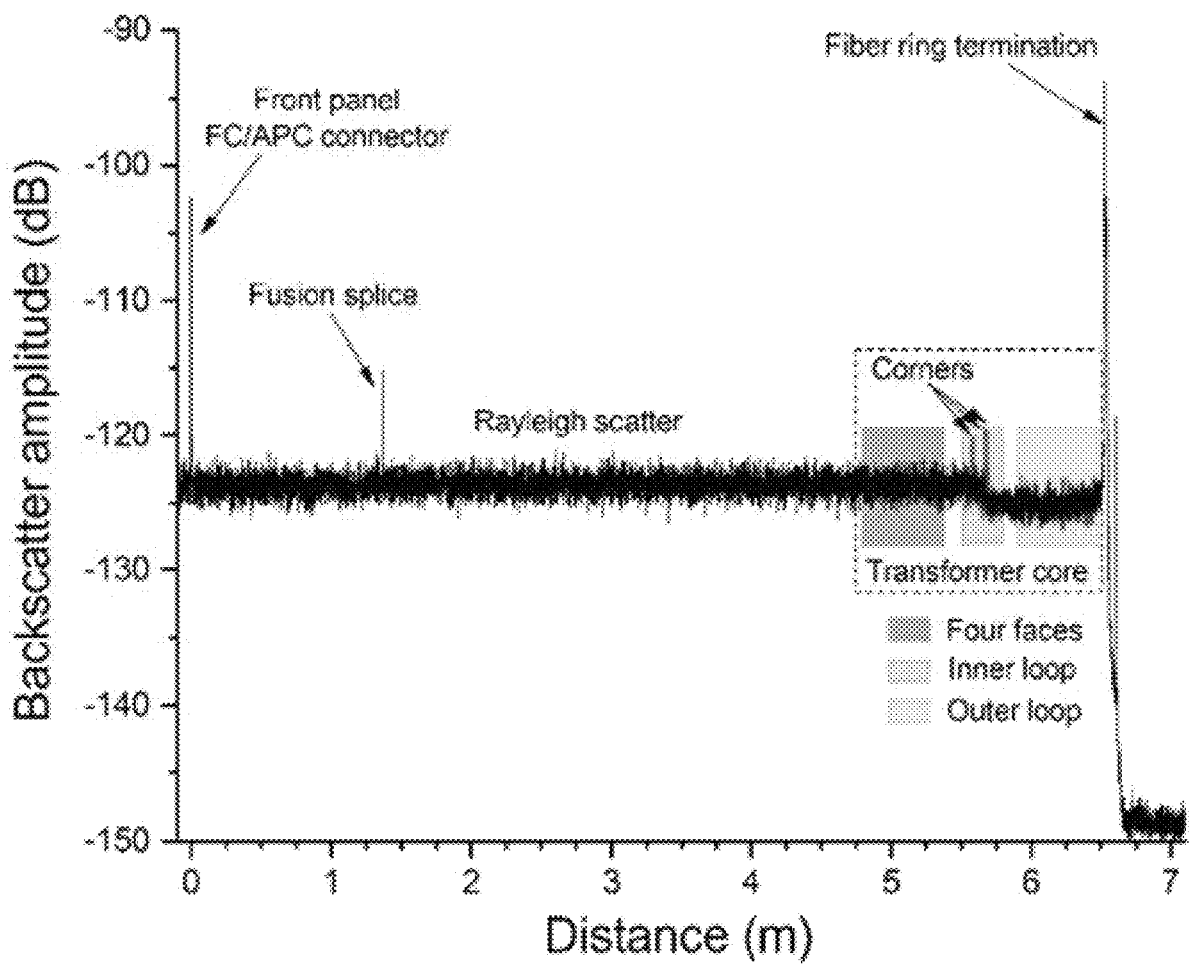
FIG. 3 is a graph showing reference backscatter signals versus distance along the sensing fiber instrumented on a transformer core.

The spatial resolution for an 85.5 nm laser sweep range is calculated to be 0.01 mm, while the sensor gauge length is selected to be 5 mm for cross-correlation based spectral shift calculation. A reference optical time-domain like trace is shown in FIG. 3, where the FC/APC connector at the front panel of the optical backscattering reflectometer, the fusion splicing point, Rayleigh backscattering in the sensing fiber are observable. It is noted that about 1.5 dB loss is caused by the sharp bend of the sensing fiber at the corners of the inner loop and no extra loss is found at the outer loop corner position because of a much larger bending radius. The transformer generates energy loss that is converted to heat once the transformer is in operation because of various sources of core loss including hysteresis, eddy current, and anomalous eddy current losses as well as losses within the primary and secondary windings. For well-designed transformers, the temperature eventually approaches a steady state value which varies spatially throughout the core and depends upon the details of (1) thermal management, (2) excitation conditions, and (3) core geometry, amongst others. The temperature rise of the transformer impacting the sensing fiber at different positions will be recorded by calibrating the thermally-induced spectral shift, while the temperature of the portion of the sensing fiber that is not attached to the transformer core is maintained at room temperature.

Figure 4:
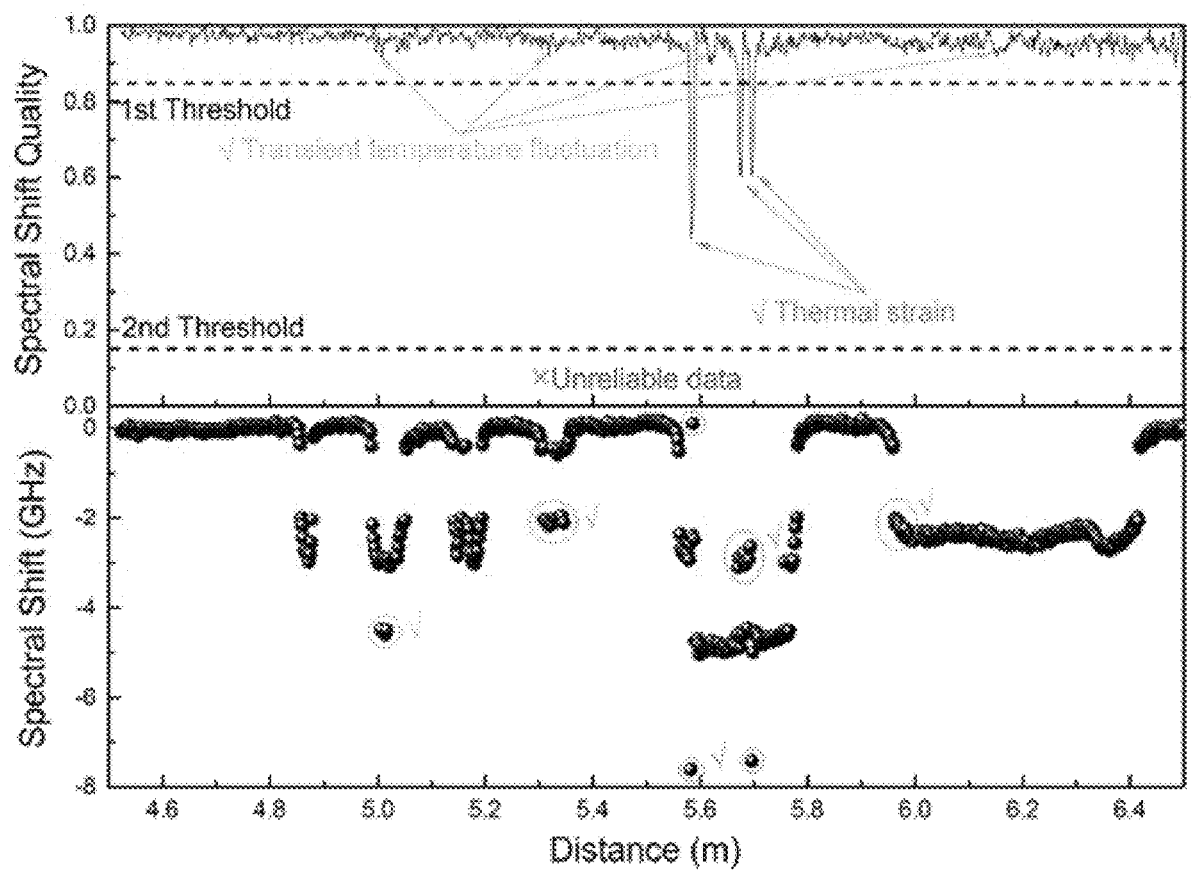
FIG. 4 shows the spectral shift of cross-correlation calculation between reference and measured Rayleigh spectra along the sensing fiber after 2 minutes of heating of a transformer core.
Figure 5:
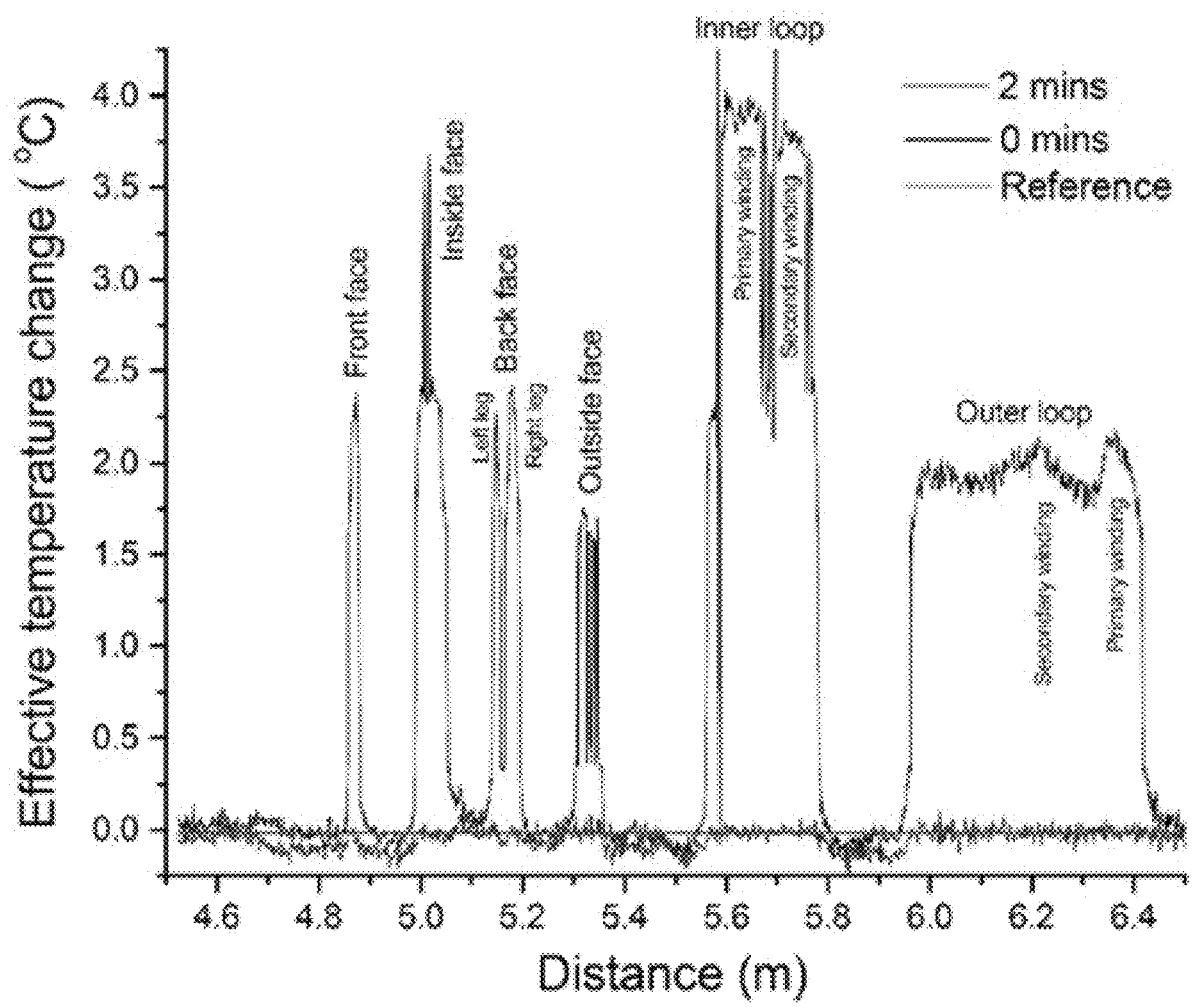
FIG. 5 shows the heating profile along the sensing fiber via reference spectra autocorrelation calculation after 0 and 2 minutes of heating of the transformer core.
Figure 6:
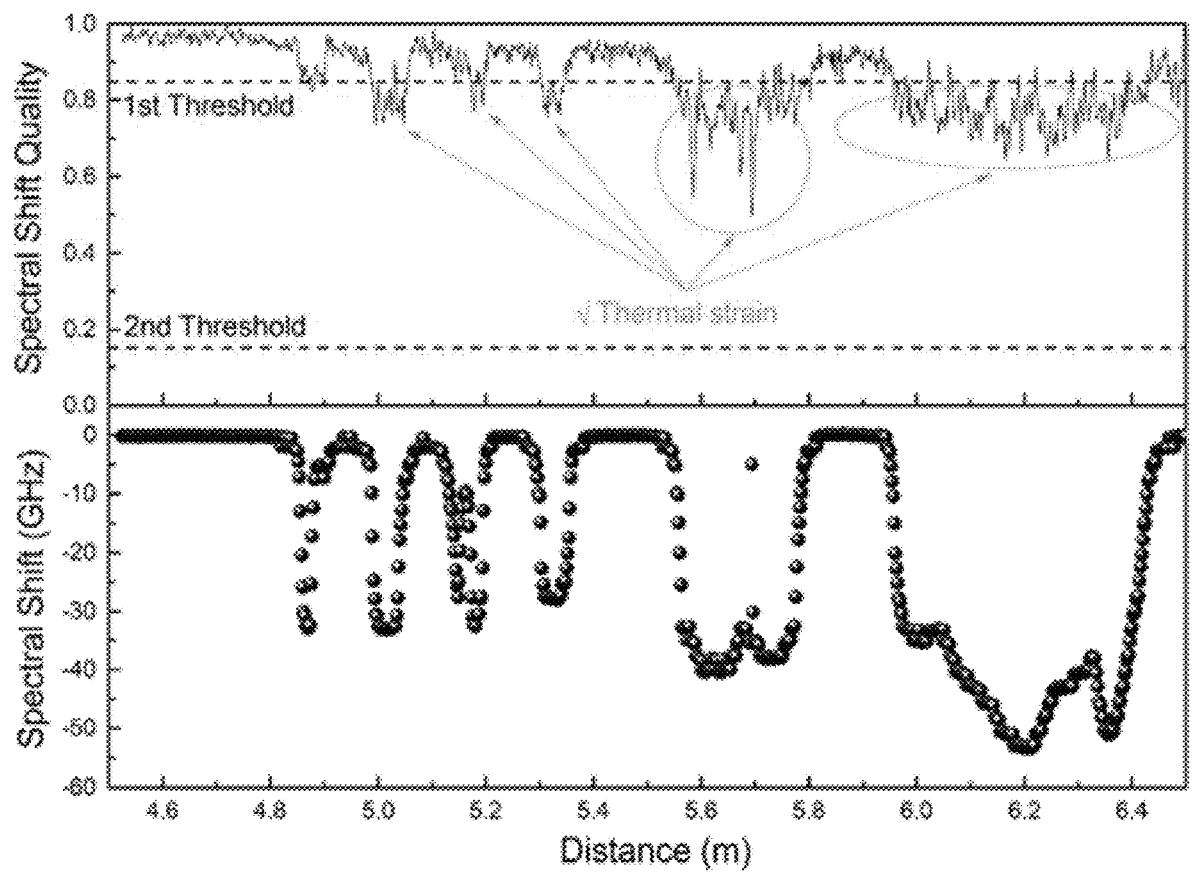
FIG. 6 shows the spectral shift of cross-correlation calculation between the reference and measured Rayleigh spectra along the sensing fiber after 28 minutes of heating of the transformer core.
Figure 7:
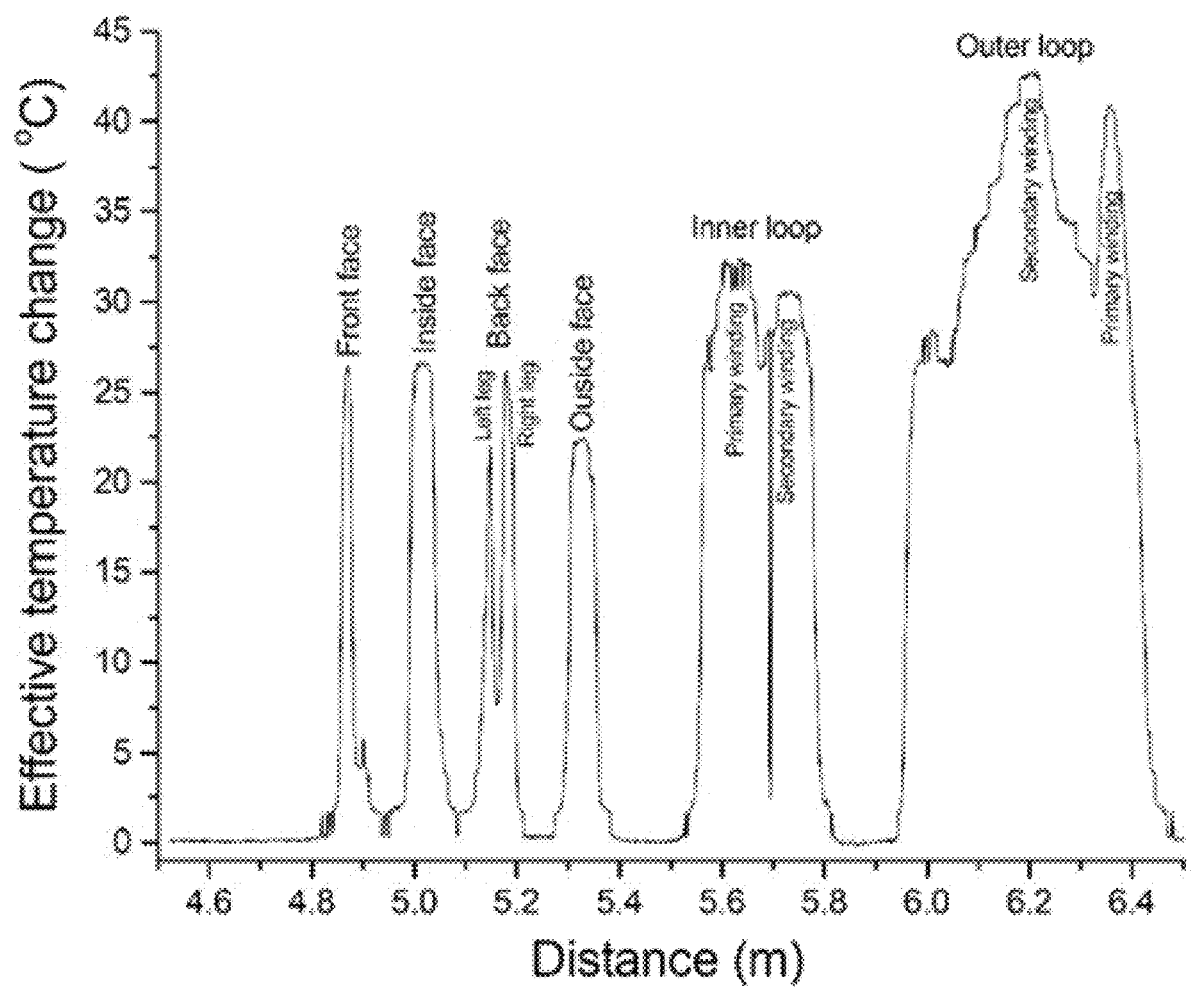
FIG. 7 shows the heating profile along the sensing fiber after 28 minutes of heating of the transformer core.

Another Rayleigh spectra is obtained when the transformer is in operation with the parameters of transformer operating conditions described in the previous section of experimental details. FIG. 4 shows the spectral shift of cross-correlation calculation between the reference and measurement Rayleigh spectra along the sensing fiber after 2 minutes of heating from the transformer core. FIG. 5 shows the reference heating profile along the sensing fiber via reference spectra autocorrelation calculation after 0 and 2 minutes of heating of the transformer core. FIG. 6 shows the spectral shift of cross-correlation calculation between the reference and test Rayleigh spectra along the sensing fiber after 28 minutes of heating of the transformer core, and FIG. 7 shows the heating profile along the sensing fiber after 28 minutes of heating of the transformer core.

Spectral shift quality, Q, as a measure of the correlation strength between the reference and measurement spectra is also evaluated by setting two thresholds which are Q=0.85 and Q=0.15, respectively. In the first region above the first threshold (0.85<Q<1), fast temperature variation occurs as the transformer is in operation. The region between the two thresholds (0.15<Q<0.85) indicates that thermal strain is induced onto the sensing fiber particularly at the inner loop corners where the optical fiber is sharply bent. The third region (0<Q<0.15) leads to invalid spectral shift quality values and fails the correlation algorithms causing unreliable spectral shift data. It is worth mentioning that erroneous spectral shift data at any specific location would not affect the validity of other sending data considering the working principal of OFDR.

As a demonstration of the capability for distributed core temperature measurements during actual operation, a reference was first taken at room temperature for the instrumented core to establish the baseline for subsequent experimental efforts. The core primary was then excited at an excitation of 100V and 50 kHz, using a 50% duty cycle square wave.

Figure 8:
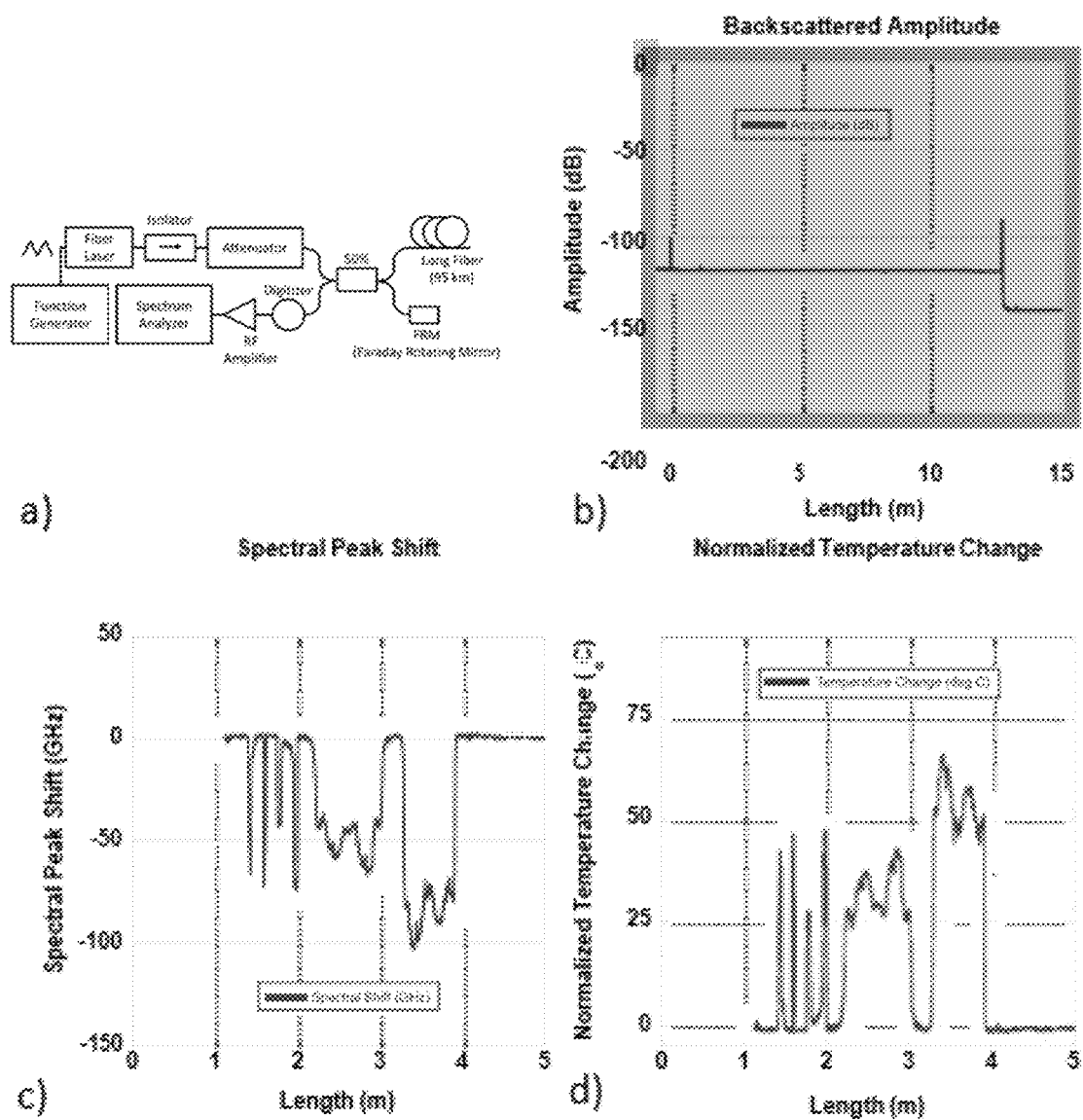
FIG. 8 shows an example method for performing optical frequency time domain reflectometry to determine local spectral shifts which are assigned to effective temperature changes locally.
Figure 9:
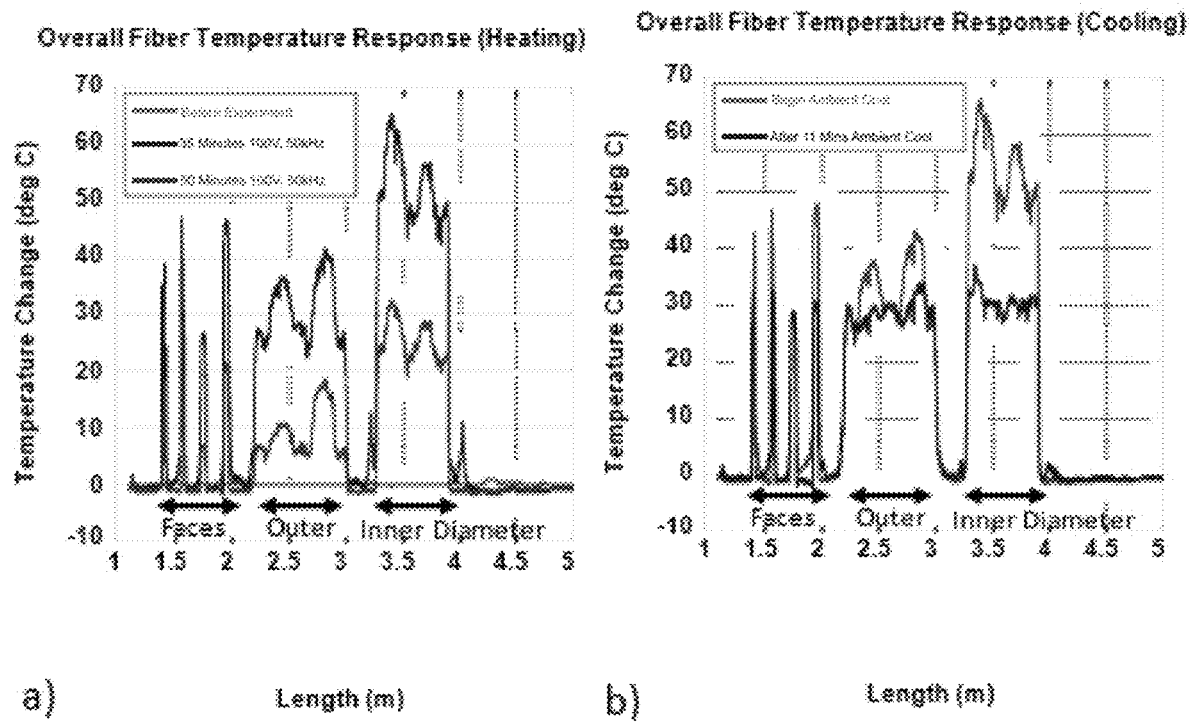
FIG. 9. shows core temperature profiles resulting from the active excitation transformer core and the subsequent cooling thereof.

The temperature rise with time was monitored as a function of spatial position along the core during operation using the instrumented fiber optic sensor. A total of 5 m of fiber sensor was interrogated during the proof-of-concept using a wavelength scan range of 1559-1582 nm, a sensor resolution of 0.1 mm, a gauge length of 0.5 mm, and a sensor spacing of 0.1 cm. The principle of the optical backscattering interferometry technique used to estimate the local temperature along the fiber is illustrated schematically in FIG. 8(a). FIG. 8(b) shows representative data of backscattered amplitude as a function of distance along the fiber. FIG. 8(c) shows the estimated spectral peak shift and FIG. 8(d) shows the associated normalized temperature change. The regions of zero normalized temperature change are associated with regions of the fiber that are not in direct thermal contact with the instrumented core, including the looped region between each end-face of the fiber for the cross-section path of FIG. 1(b) to ensure no significant straining of the fiber during heating, In FIGS. 8(a) and 8(b), the regions of elevated temperature along the fiber are labeled corresponding to the region of the core in which they represent, namely the cross-sectional area faces, as shown in FIG. 1(b) or the inner and outer core diameters, as shown in FIG. 1(a). In FIG. 9(a), the core is observed to heat with time because of the active primary excitation, while in FIG. 9(b), the excitation has been turned off and the core is cooling under ambient conditions. Within a given region of the core, it is clear that there are significant variations in temperature along the surface of the core by as much as approximately 20° C. Hot spots on the core surface inner and outer diameters are likely to result from the presence of the primary and secondary windings as well as the core gaps and the inner bends in the core geometry. It can also be observed that the inner diameter of the core is at a correspondingly larger temperature than the outer core diameter. In fact, the overall temperature profile throughout the core can be illustrated more clearly by taking a closer look at selected regions of temperature profiles corresponding to individual core faces/diameters.

Figure 10:
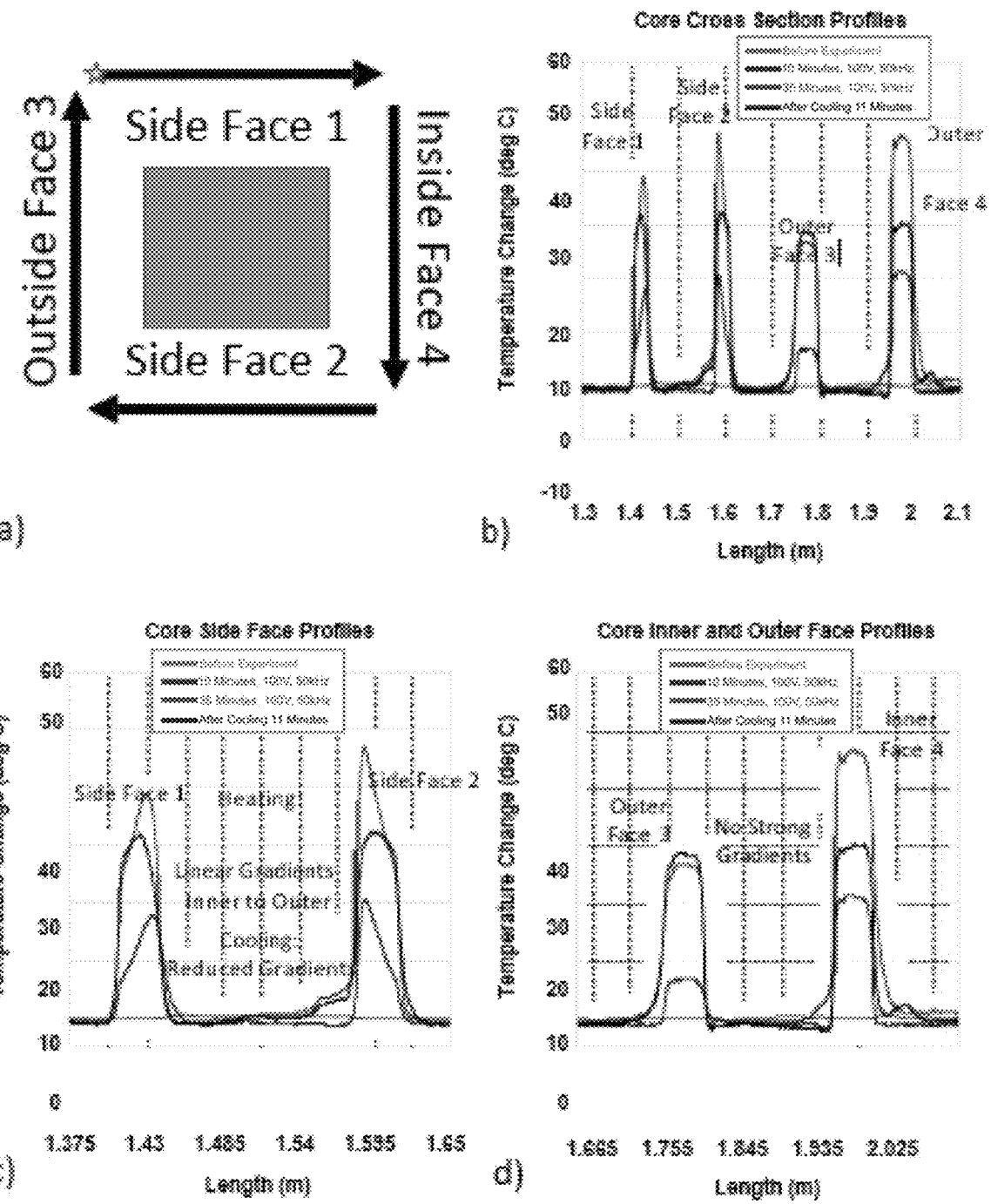
FIG. 10 shows localized core temperature profiles for various faces of the transformer core

FIG. 10 shows the core temperature profiles. FIG. 10(a) the cross-sectional face profiles are illustrated. In FIG. 10(b), the overall profiles are illustrated for all four faces with a zero temperature change between faces corresponding to the fiber loops for strain relief which are not in contact with the core surface. A few key illustrations can be made based upon the obtained data: (1) the side faces demonstrate a linear gradient in temperature profile from the inner to outer core diameter, (2) the inner and outer faces do not show a linear gradient and instead appear to show a peak near the middle of the core face, and (3) the inner face is at a significantly higher temperature than the outer face.

These trends are illustrated more clearly in the data presented for each of the types of faces in FIGS. 9(c) and 9(d). In FIG. 9(c), the temperature rise of the core side faces can be clearly resolved with increasing time of primary excitation with the linear gradient from inner to outer surface noted above. Upon removal of the excitation voltage/current, a cooling is observed and, in particular, the linear gradient between the core inner and outer diameters becomes dramatically reduced. For the inner and outer faces presented in FIG. 10(d), the lack of strong gradient across the face is clearly observed with the core inner face being significantly higher than the outer face during the core excitation. After cooling due to removal of the active excitation, the temperatures of the inner and outer faces quickly begin to approach one another, which is consistent with the reduced gradient observed on the side faces. A significant gradient in core temperature between inner and outer faces is expected due to the increased flux concentration at the inner diameter of the core relative to the outer diameter. In addition, the well-established anisotropic thermal conductivity of cores in this class of materials can also enhance the gradient in temperature due to a much larger effective thermal conductivity in the plane of the laminated tape wound cores as compared to the normal direction to the laminations.

Figure 11:
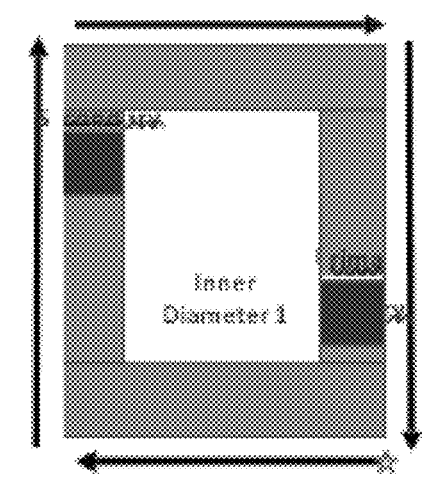
FIG. 11 shows core temperature profiles for the outer and inner diameters of the transformer core.
Figure 11:
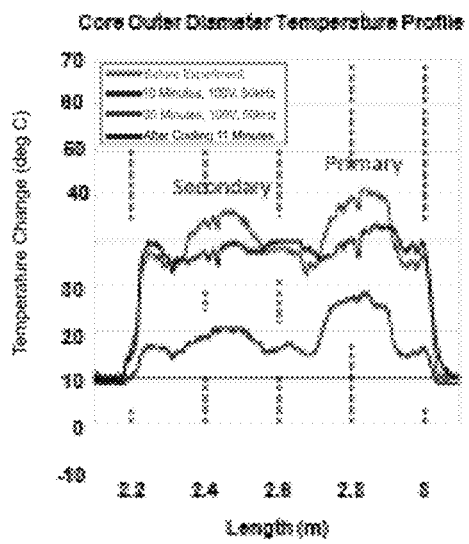
Figure 11:
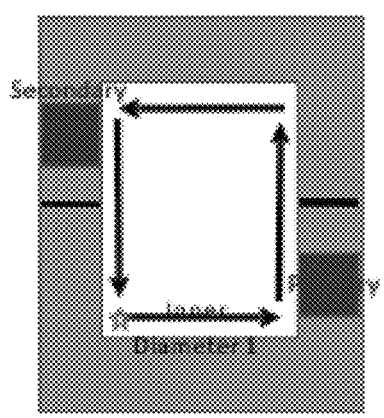
Figure 11:
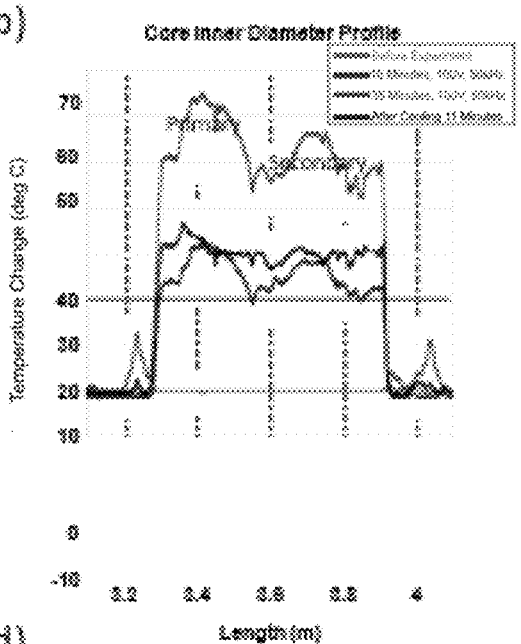

FIG. 11(b) shows the core temperature profile for the outer diameter, shown schematically in FIG. 11(a). FIG. 11(d) shows the core temperature profile for the inner diameter, shown schematically in FIG. 11(c). The results are generated by a 100V, 50 kHz, 50% duty cycle square wave excitation for 35 minutes and after removal of the excitation for 11 minutes resulting in core cooling. Consistent with the results of FIG. 9, the inner core diameter is consistently at a higher temperature than the outer core diameter during the active core excitation from the primary side. In addition, an oscillation of surface temperature can be observed with two primary, broad peaks appearing to be the most prominent features for both the inner and outer core diameters. One of the two peaks appears to be consistently larger than the other, and both peaks are associated with the primary and secondary winding locations on the core with the larger peak being associated with the primary winding. It is interesting to note that upon removal of the active excitation, the thermal gradient along the outer and inner diameter surfaces as well as the temperature differential between the surfaces are significantly reduced as compared to the case in which the excitation is active. Such observations are fully expected due to the details of the magnetic flux excitation as a function of spatial position and excitation details with localized heating within a given core geometry.

In other embodiments, a chemically sensitive coating may be applied to the outside of the cladded fiber to locally strain the optical fiber in response to various chemical species of interest. These could include, for example, $H_2$, CO, acetylene, $CH_4$, $CO_2$, $O_2$, $SF_6$, and any others. In another embodiment, the chemically sensitive coating could be applied to an unclad fiber or to a fiber having the cladding modified and/or removed to result in a significant change in local absorbance or scattering by the fiber in response to chemical species of interest. Example functional layers could include oxides, metals such as Pd, metallic/oxide based nanocomposites such as Pd incorporated oxides, organics, metalorganic frameworks and inorganic/organic hybrids.

In yet another embodiment a magnetic field sensitive, magnetostrictive coating may be applied to the cladded fiber, resulting in local straining of the fiber in response to the presence of magnetic fields. In yet other embodiments, a magnetic field sensitive or optically responsive coating could be applied to a cladded, unclad it, or a cladding modified and/or cladding removed optical fiber which is a significant response in optical properties to applied magnetic fields resulting in a change in local absorbance or scattering by the optical fiber. Example functional layers could include FeCo-alloys, TbFeDy-alloys, NiFe-alloys, and any other metallic or non-metallic material with a significant strain response to applied magnetic fields (magnetostrictive coatings). Example functional layers could also include perovskites and other correlated electron based oxides with strong magnetic field dependent electronic conductivities such as $(La,Sr)MnO_3$, $(La,Sr)(Co,Fe)O_3$, $LaTiO_3$ and any other materials with significant magnetic field dependent electronic transport behavior (GMR, TMR, etc,)

In yet other embodiments, an electric field sensitive, electrostrictive/piezoelectric coating may be applied to the cladded fiber resulting in local straining of the fiber in response to the presence of local electric fields. In yet other embodiments an electric field sensitive, optically responsive coating may be applied to a cladded, unclouded, or cladding modified and/or cladding removed optical fiber which has a significant response in optical properties to applied electric fields, resulting in a change in the local absorbance or scattering by the optical fiber. Example functional layers could include $LiNbO_3$, quartz, langasite, PZT, and any other metallic or non-metallic material with a significant strain response to applied electric fields (electrostrictive/piezoelectric coatings). Example functional layers could also include oxides or polymers with strong electric field dependent electronic conductivities and any other materials with significant electric field dependent electronic transport behavior Example functional layers could include electro-optical materials.

The novel technique of the present application is, amongst other applications, capable of being used to aid in the identification of local hot spots during the operation of a core which might otherwise result in thermal runaway and failure of the component. Although the concept is demonstrated on a prototype core in a laboratory setting, prevention of thermal runaway and failures for large power transformers and other significant electrical power assets (inductors, motors, etc.) can yield significant economic and social benefits.

Magnetic Field Sensing Detail

In an embodiment a magnetically sensitive coating is applied to an optical fiber, wherein the magnetically sensitive coating is a material with optical properties that change in response to changes in the magnetization of said coating.

Suitable coatings include any material having an absorption coefficient that depends on the magnitude of an external magnetic field to said coating.

Exemplary coatings include perovskites and other correlated electron based oxides with strong magnetic field dependent electronic conductivities such as $(La,Sr)MnO_3$, $(La,Sr)(Co,Fe)O_3$, $LaTiO_3$ and any other materials with significant magnetic field dependent electronic transport behavior (Giant Magnetoresistance, Tunneling Magnetoresistance, Colossal Magnetoresistance, etc), and combinations thereof.

Figure 12A:
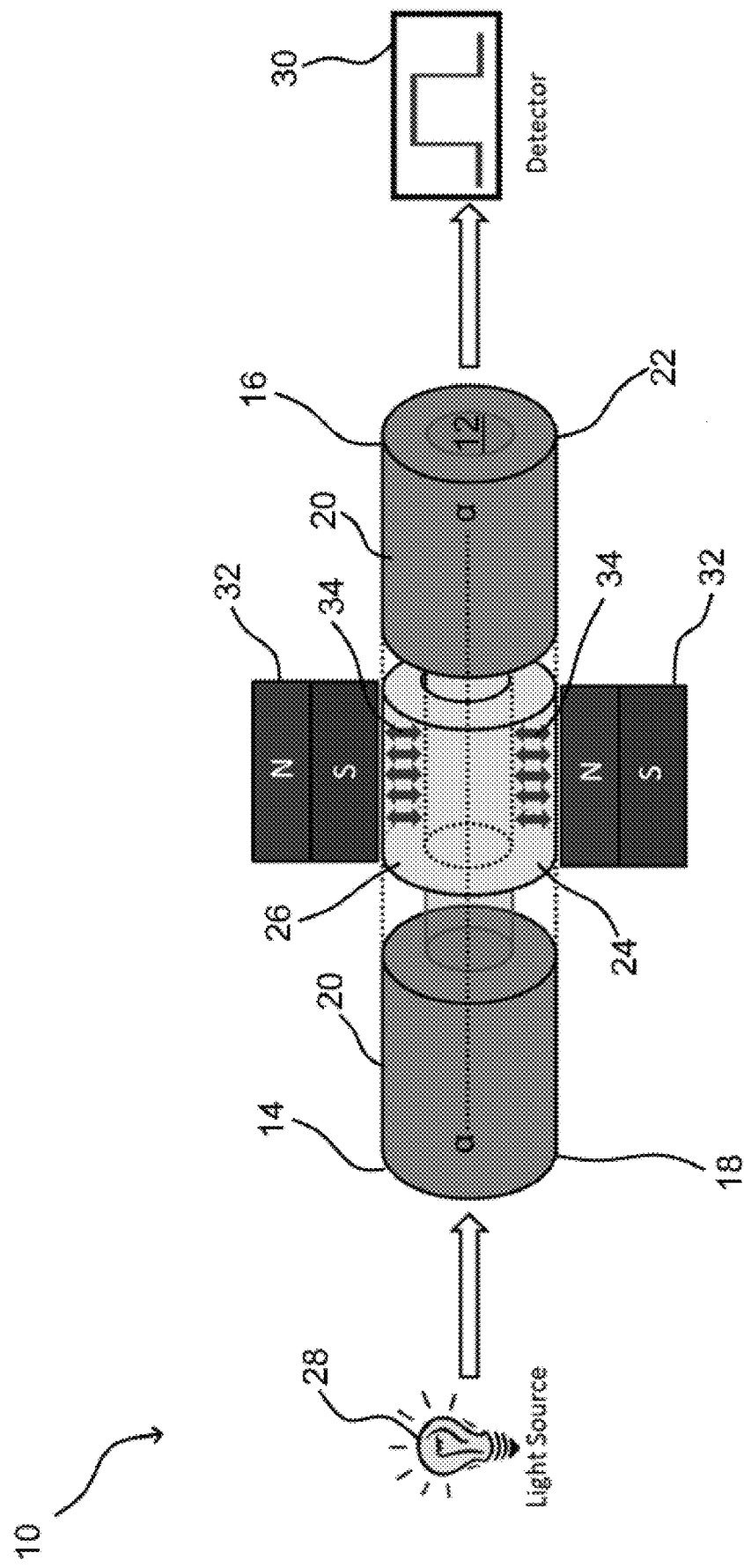
FIG. 12A shows a schematic of a magnetic field sensor using a fiber coated with a magnetically sensitive material.

FIG. 12A shows a simplified schematic of a magnetic field sensor 10 comprising an optical fiber 12 extending between a first 14 and second end 16 along the longitudinal axis a of the fiber. A proximal portion 18 of the fiber 12 proximal to the first end 14 is overlaid and surrounded by a cladding 20. The distal portion 22 of the fiber 12 is also overlaid and surrounded by the cladding 20. A medial portion 24 of the fiber 12 positioned between the proximal 18 and distal portions 20 of the fiber is not overlayed by the cladding 20. The medial portion 24 of the fiber 12, is instead overlaid and surrounded by a magnetically sensitive material 26.

The above describes the magnetic field sensor 10 featuring proximal 18, medial 24, and distal portions 22. This is exemplary and not meant to be limiting. Practical embodiments can comprise a plurality of portions of fiber overlaid by magnetically sensitive material 26 positioned between portions of the fiber overlaid by cladding 20. Practical embodiments can also comprise an end-coated segment of fiber overlaid by magnetically sensitive material 26.

Returning to FIG. 12A, a light source 28 is positioned adjacent to the proximal portion 18 of the fiber and upstream of a detector 30 positioned adjacent to the distal 22 portion of the fiber. A pair of magnets 32 are shown adjacent to the coated portion of the fiber in FIG. 12A and generating a magnetic field 34 that is incident upon said coated portion. The presence of magnets in proximity to the sensor is provided for illustrative purposes only as magnetic fields can be generated through a number of means including current carrying wires, magnets, and other sources of magnetic fields.

A salient feature of the invention is the magnetically sensitive material 26 used as an overlayment on portions of a fiber, or as an overlayment on the end of a segment of a fiber. The magnetically sensitive material comprises any material that exhibits a measurable variation to an optical constant in response to an applied magnetic field, and preferably magnetic materials that exhibit a relatively large and magnetic field dependent electronic conductivity such that the optical constant response is also relatively large. Suitable materials include correlated electron based oxides with magnetic field dependent electronic activities and other materials with magnetic field dependent electronic transport behavior. Exemplary materials include perovskites, $(La,Sr)MnO_3$, $(La,Sr)(Co,Fe)O_3$, $LaTiO_3$ and any other materials with significant magnetic field dependent electronic transport behavior (e.g. giant magnetoresistance and tunnel magnetoresistance), and combinations thereof.

The light source and detector shown in FIG. 12A are illustrative of a simplified magnetic field measurement setup compatible with the sensor platform 10 shown in FIG. 12A and are not meant to be limiting. Surprisingly and unexpectedly, the inventors have discovered that the invented magnetic field sensor described herein is suitable for use using simple optical detection methods as opposed to complicated measurement schemes required by prior art methods. For example, an embodiment uses a simple transmission based detector to measure light absorbed and or transmitted from the magnetically sensitive material. Alternatively, an embodiment uses a simple reflection based detector to measure light absorbed and or reflected from the magnetically sensitive material.

In an embodiment, the magnetic field measurement system uses light of one or more specified wavelengths which, wherein the wavelength or wavelengths generate a measurable response through the optical interrogator and detection system. The light of one or more desired wavelengths travels through the fiber of the sensor. When light traveling along the fiber reaches a portion of the fiber surrounded by magnetically sensitive material 26, a portion of light is absorbed by magnetically sensitive material 26. In the case of a transmission based detector, light that is not absorbed by the magnetically sensitive material 26 continues traveling through the fiber until collected by a detector. The detector comprises any instrument capable of measuring incident light. Exemplary detectors include spectrometers, photodiodes, and combinations thereof. The intensity of light transmitted (not absorbed) by the magnetically sensitive material 26 is dependent on the absorption coefficient of said magnetically sensitive material which depends on the magnetization of the magnetically sensitive material 26.

As changing magnetization of the magnetically sensitive material 26 changes the optical constants (including the absorption constant) of the material, the absorption of light by the material is sensitive to shifts in the magnitude of an externally applied magnetic field. Any changes in the magnetic field are therefore reflected in the measured optical transmission, which will be normalized with the transmission when there is no magnetic field. An alternative embodiment can utilize a reflection based detector in which the magnetically sensitive material 26 is coated on the end of an optical fiber, and the light that is not absorbed or transmitted is reflected back to a detector as shown in FIG. 12B.

Figure 12B:
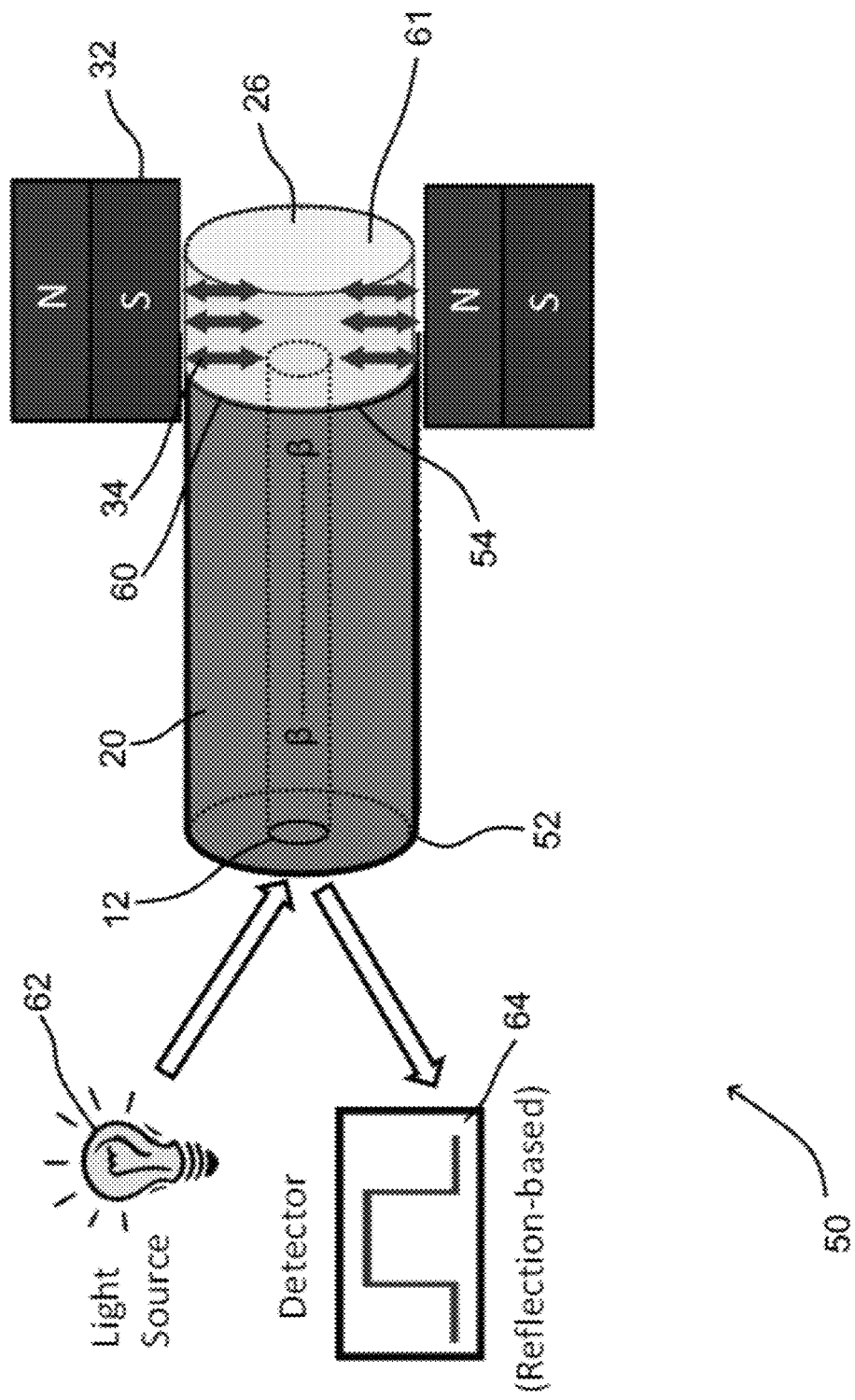
FIG. 12B shows a schematic of a magnetic field sensor using a fiber having an end portion coated or capped with a magnetically sensitive material.

FIG. 12B shows a simplified schematic of a magnetic field sensor 50 comprising an optical fiber 12 extending between a first 52 and second end 54 along the longitudinal axis of the fiber β. As shown in FIG. 12B, the portions of the fiber extending between its first 52 and second ends 54 are overlaid with the cladding 20 shown in FIG. 12A 20. In the embodiment 50 shown in FIG. 12B the end 54 of the fiber 12 terminates in a substantially flat end 56 comprising a cross section 58 of the fiber 12 surrounded by the cladding 12. In this embodiment, the terminating end 60 of the clad fiber is capped by a cap 61 comprising the magnetically sensitive material 26.

FIG. 128 shows a light source 62 and detector 64 positioned proximal to the first end 52 of the fiber. FIG. 12B also shows a pair of magnets 32 adjacent to the capped portion of the fiber. However, it should be noted that the presence of magnets in proximity to the sensor is not a requirement of the embodiment, as magnetic fields 34 can be generated through a number of means including current carrying wires, magnets, and other sources of magnetic fields.

Surprisingly and unexpectedly, the magnetically sensitive material 26 enables simple reflection-based detecting of magnetic fields using an optical fiber. In this the reflection-based setup shown in FIG. 12B is suitable for use with the same, simple optical detectors as the embodiment 10 shown in FIG. 12A.

The reflectance based sensor 50 shown in FIG. 12B with an end cap of magnetically sensitive material is suitable for use in conjunction with Rayleigh backscattering as described above. Similarly, such an embodiment can be used in conjunction with a quasi- or fully distributed scheme in which backscattering through methods such as Rayleigh scattering enables distributed interrogation.

The invented magnetic field sensor is suitable for measuring the magnetic field and changes thereto of any electronic component that generates a magnetic field. Said magnetic field sensor is suitable for measurement of the magnetic field and changes thereto both inside and outside said electronic component. Given the compact nature of the invented magnetic field sensor, the sensor is suitable anywhere the coated fiber can be placed in electromagnetic communication with the electronic component being monitored. As used herein, electromagnetic communication comprises a position adjacent to an electromagnetic component such that a magnetic field generated by said component impinges on an object positioned in electromagnetic communication to said component.

An embodiment of the instant invention comprises instrumenting one or more portions of a component that generates a magnetic field when energized by placing an optical fiber in electromagnetic communication with one or more portions of said component generating a magnetic field, the optical fiber being coated with a material that has optical properties that change with the magnitude of a magnetic field incident on said material; energizing the component that generates a magnetic field by applying a voltage thereto; interrogating the optical fiber when the component that generates a magnetic field is energized by detecting changes in intensity and/or polarization of in the optical fiber; determining changes in the magnetic field based on the detected changes in the intensity and/or polarization of transmitted, reflected, or backscattered light; and identifying changes in the magnetic field of the component that generates a magnetic field; wherein the changes in the magnetic field due to the component that generates a magnetic field alter the optical properties of the optical fiber as a result of the coating on the optical fiber.

The invented magnetic field sensors are suitable for use inside and outside components generating electric fields and can be used in remote sensing setups. This allows for the sensors to be used in harsh and dangerous environments for monitoring by an observer in a remote location and also enhances compatibility with deployment of the invented sensors in the internal portions of electromagnetic components.

To generate the invented magnetic field sensor, portions of cladding to be replaced by magnetic sensitive material are removed, typically by etching. This leaves portions of bare fiber after etching such that the coating is in optical communication with the fiber. Alternatively, optical fibers without claddings or with thin claddings that still permit some optical communication between a coating and the optical fiber can be utilized. The bare or thin cladding portions then receive magnetically sensitive material deposited using techniques such as, but not limited to, physical vapor deposition, atomic layer deposition, sol-gel dipping, and combinations thereof. In many cases, a post-deposition annealing process is utilized such that the film adopts the appropriate crystal lattice structure and dopant concentration functionalizing it for magnetic field sensing. As deposited, many oxide thin film materials are shown to have little magnetic response and electronic conducting behavior characteristics. For example, annealing a magnetically sensitive coating comprising a magnetic oxide in varying oxygen composition environments can change the number of oxygen vacancies in the oxide film. Consequently, the electronic transport and magnetic properties which depend upon the presence of oxygen atoms and vacancies, can be tuned by post deposition processing. The change in composition is evident in the distortion of the oxide unit cell which can be observed as change in lattice structure. As such, $La_{0.8}Sr_{0.2}MnO_3$ (LSMO) films have been prepared on a variety of single crystal substrates ($SrTiO_3$, $(La_{0.18}Sr_{0.82})(Al_{0.59}Ta_{0.41})O_3$, $LaAlO_3$). After annealing the samples in air post deposition, it was demonstrated that the same film grown on different substrates (and therefore slightly different lattice structures and distortions) will have varying magnitudes of magnetization and electronic conductivity. In addition, annealing samples in varying compositions resulted in the suppression or enhancement of magnetic properties of LSMO, indefinitely. As such, the properties of magnetic oxides can be customized.

Example

A 50 nm thick $La_{0.8}Sr_{0.2}MnO_3$ (LSMO) film was grown by RF magnetron sputtering on a single crystal $SrTiO_3$ (STO) substrate to produce LSMO films with a (001) crystal structure orientation using RF magnetron sputtering techniques known in the art. See S. Swann, Physics in Technology, 1988, 19, 67. The film is deposited from a target with the specified composition using an RF magnetron power source. STO substrates provide a single crystal template with a similar lattice constant as LSMO, thereby minimizing the formation of defects and dislocations at the interface between the LSMO film and STO. Following deposition, an additional annealing step was performed, as referenced above. The LSMO film was annealed in air (oxygen composition approximately 20%) at 800° C. From subsequent characterization of the crystal lattice structure, through X-ray diffraction (XRD), the (001) orientation was observed in the LSMO film. Further annealing in a nitrogen rich (oxygen poor) atmosphere resulted in the LSMO unit cell distortion observed by a shift in the characteristic XRD peak. The resulting LSMO exhibited ferromagnetic ordering and associated magnetization responses (as seen by the magnetization versus field responses in FIGS. 13A and 13B), indicating the ability to generate a magnetic field dependent optical response. Magnetic response data was gathered using a vibrating sample magnetometer, where magnetization is captured by observing the change in induced current as the thin film is exposed to an external magnetic field.

The experimental work also links the ferromagnetic response to atmospheric composition during annealing. In FIG. 13A, the LSMO film sample was oriented with the surface parallel to an external magnetic field. The ferromagnetic data indicates this orientation is the easy axis, characterized by a rapid switching of magnetization direction at a certain external field magnitude. In addition, the magnetization remained along this axis even after the external field was removed. In contrast, FIG. 13B shows the thin film oriented with the surface perpendicular to the external magnetic field. Along this hard axis, the magnetic switching occurred more gradually. When the external field was removed, the magnetization along this direction also disappeared. In both directions, the magnetization was significantly reduced after the film was annealed in an oxygen-poor atmosphere. However, this effect was reversed when the film was annealed again in an oxygen-rich environment, demonstrating another aspect of tunability for the LSMO material. This suggests that varying external magnetic sources will result in corresponding magnitudes of optical activity in LSMO (and other similar materials), since electronic transport behavior is dependent on magnetization. Further experiments with other substrates show that a ferromagnetic LSMO film can be grown on different substrates, provided that the lattice constant is comparable to LSMO at c=3.876 Å, as explained in section [057]. It has also been demonstrated in the literature that a polycrystalline LSMO film will also exhibit ferromagnetic behavior, making it a suitable candidate as a magnetic sensing layer for an optical fiber.

After verifying the magnetic properties of LSMO, testing of the optical properties was then carried out to demonstrate the effect of an applied magnetic field. FIGS. 14A and B show the measured optical transmission through a 150 nm and 50 nm, respectively, thick LSMO film, grown on STO single crystal substrate in response to an externally applied magnetic field. The same data is plotted as a function of magnetic field as seen in FIG. 14C, showing a hysteretic behavior in transmission as the magnetic field was cycled, aside from the drift that is seen at the largest and smallest wavelengths. This is also shown in the heat map shown in FIG. 14D, which shows a general normalized intensity increase as the magnitude of the external field increases.

Experimentally, the absorption of LSMO decreases almost linearly as magnetic field increases thereby resulting in an approximately linear increase in transmission. The same intensity increase is repeated when the magnetic field is reversed, as is expected in a case where the optical constants depend only on the value of the magnetization and not the orientation. Isolating the intensity change for individual wavelengths shows a unilateral and linear response to magnetic field between the 400 nm to 900 nm wavelength range, corresponding to the broad peaks observed in optical absorption spectra of the LSMO films.

Optical measurements in the presence of magnetic fields were repeated with a 50 nm film to characterize the effects of thickness on the optical response by the film to the presence of a magnetic field. A change in absorption coefficient scales with sample thickness. FIG. 14B shows empirically that the intensity response of the transmission drops by almost an order of magnitude when comparing a 50 nm film to a 150 nm film. The relationship between optical absorption and incident magnetic field from experimental data demonstrate the viability of using LSMO as a material for magnetic field sensing. This demonstration can be advanced for reflectance and transmission detector based magnetic field sensors, as well as for distributed sensing of magnetic fields by depositing the films on long lengths of optical fibers.

As used herein, energizing means applying a voltage across or running current through an electromagnetic component.

An embodiment of the invention provides a method for measuring the magnetic field of an electromagnetic component comprising: instrumenting one or more portions of an electromagnetic component by placing an optical fiber in electromagnetic communication with the one or more portions of said electromagnetic component; energizing the electromagnetic component; interrogating the optical fiber using light and an optical detector; and determining changes in the magnetic field incident on the optical fiber based on the detected changes in the light received by the optical detector. In an embodiment, the optical fiber is coated with a magnetically sensitive material, wherein the magnetically sensitive material comprises a material that exhibits a measurable variation to an optical constant in response to an applied magnetic field. In an embodiment, the magnetically sensitive material is chosen from the group consisting of perovskites, $(La,Sr)MnO_3$, $(La,Sr)(Co,Fe)O_3$, $LaTiO_3$, and combinations thereof. In an embodiment, the optical detector is a transmission-based detector selected from the group consisting of spectrometer, photodiode, and combinations thereof. In an embodiment, at least one portion of the electromagnetic component is an exterior portion, and wherein at least one portion of the electromagnetic component is an interior portion. In an embodiment, observing the changes to the magnetic field in a location remote from the electromagnetic component. In an embodiment, the electromagnetic component is a component that generates a magnetic field when energized. In an embodiment, changes in the light travelling through the fiber are detected using a transmission based detector selected from the group consisting of spectrometer, photodiode, and combinations thereof.

Another embodiment of the invention provides a method for measuring a magnetic field of an electromagnetic component comprising: instrumenting one or more portions of a component that generates a magnetic field when energized by placing an optical fiber in electromagnetic communication with one or more portions of said component generating a magnetic field, the optical fiber being coated with a material that has optical properties that change with the magnitude of a magnetic field incident on said material; energizing the component that generates a magnetic field; interrogating the optical fiber when the component that generates a magnetic field is energized, wherein interrogating the optical fiber comprises detecting changes in the light traveling through the optical fiber; determining changes in the magnetic field based on the detected changes in the light traveling through the optical fiber; and identifying changes in the magnetic field of the component that generates a magnetic field; wherein the changes in the magnetic field of the component that generates a magnetic field alter the optical properties of the optical fiber as a result of the coating of the optical fiber.

In an embodiment, the material that has optical properties that change with the magnitude of a magnetic field incident on said material comprises a magnetically sensitive material selected from perovskites, $(La,Sr)MnO_3$, $(La,Sr)(Co,Fe)O_3$, $LaTiO_3$, and combinations thereof. In an embodiment, changes in the light travelling through the fiber are detected using a transmission based detector selected from the group consisting of spectrometer, photodiode, and combinations thereof. In an embodiment, at least one portion of the electromagnetic component is an exterior portion, and wherein at least one portion of the electromagnetic component is an interior portion.

Another embodiment of the invention provides A method for measuring a magnetic field of an electromagnetic component comprising: instrumenting one or more portions of a component that generates a magnetic field when energized by placing an optical fiber in electromagnetic communication with one or more portions of said component generating a magnetic field, the optical fiber terminating with a cap comprising a material that has optical properties that change with the magnitude of a magnetic field incident on said material; energizing the component that generates a magnetic field; interrogating the optical fiber when the component that generates a magnetic field is energized, wherein interrogating the optical fiber comprises detecting changes in the light traveling through the optical fiber; determining changes in the magnetic field based on the detected changes in the light traveling through the optical fiber; and identifying changes in the magnetic field of the component that generates a magnetic field; wherein the changes in the magnetic field of the component that generates a magnetic field alter the optical properties of the optical fiber as a result of the coating of the optical fiber. In an embodiment, the material that has optical properties that change with the magnitude of a magnetic field incident on said material comprises a magnetically sensitive material selected from perovskites, $(La,Sr)MnO_3$, $(La,Sr)(Co,Fe)O_3$, $LaTiO_3$, and combinations thereof.

In yet another embodiment, the invention provides a method of measuring a magnetic field of an electromagnetic component: instrumenting one or more portions of an electromagnetic component by placing an optical fiber in electromagnetic communication with the one or more portions of said electromagnetic component, the optical fiber comprising a fiber in optical communication with a magnetically sensitive material selected from the group consisting of perovskites, $(La,Sr)MnO_3$, $(La,Sr)(Co,Fe)O_3$, $LaTiO_3$, and combinations thereof: energizing the electromagnetic component; interrogating the optical fiber when the electromagnetic component is energized by detecting changes in intensity, phase, and/or polarization of Rayleigh backscattering in the optical fiber; determining changes in the magnetic field based on the detected changes in the intensity, phase, and/or polarization of Rayleigh backscattering; and wherein the changes in the magnetic field of the electromagnetic component alter the optical properties of the magnetically sensitive material in contact with the optical fiber. In an embodiment, the electromagnetic component is a component that generates a magnetic field when energized. In an embodiment, the method further comprises: creating a continuous, spatially resolved distribution of the magnetic field in the instrumented portions of the electromagnetic component.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above. As utilized herein, the terms "about," "substantially," and other similar terms are intended to have a broad meaning in conjunction with the common and accepted usage by those having ordinary skill in the art to which the subject matter of this disclosure pertains. As utilized herein, the term "approximately equal to" shall carry the meaning of being within 15, 10, 5, 4, 3, 2, or 1 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

What is claimed is:

1. A method for measuring the magnetic field of an electromagnetic component comprising:
    instrumenting one or more portions of an electromagnetic component by placing an optical fiber in electromagnetic communication with the one or more portions of said electromagnetic component, wherein the optical fiber is coated with a magnetically sensitive material comprising a material having a magnetic field dependent electronic conductivity;
    energizing the electromagnetic component;
    interrogating the optical fiber using light and an optical detector; and
    determining changes in the magnetic field incident on the optical fiber based on the detected changes in the light received by the optical detector.

2. The method of claim 1 wherein the magnetically sensitive material further comprises a material that exhibits a measurable variation to an optical constant in response to an applied magnetic field.

3. The method of claim 2 wherein the magnetically sensitive material is chosen from the group consisting of perovskites, $(La,Sr)MnO_3$, $(La,Sr)(Co,Fe)O_3$, $LaTiO_3$, and combinations thereof.

4. The method of claim 1 wherein the optical detector is a transmission- based detector selected from the group consisting of spectrometer, photodiode, and combinations thereof.

5. The method of claim 3 wherein at least one portion of the electromagnetic component is an exterior portion, and wherein at least one portion of the electromagnetic component is an interior portion.

6. The method of claim 3 further comprising observing the changes to the magnetic field in a location remote from the electromagnetic component.

7. The method of claim 1 wherein the electromagnetic component is a component that generates a magnetic field when energized.

8. The method of claim 7 wherein changes in the light travelling through the fiber are detected using a transmission based detector selected from the group consisting of spectrometer, photodiode, and combinations thereof.

9. The method of claim 1 wherein the optical fiber does not include a Fiber Bragg Grating.

10. A method for measuring a magnetic field of an electromagnetic component comprising:
    instrumenting one or more portions of a component that generates a magnetic field when energized by placing an optical fiber in electromagnetic communication with one or more portions of said component generating a magnetic field, the optical fiber being coated with a material that has optical properties that change with the magnitude of a magnetic field incident on said material, wherein said material that has optical properties comprises a correlated electron based oxide having a magnetic field dependent electronic conductivity;
    energizing the component that generates a magnetic field;
    interrogating the optical fiber when the component that generates a magnetic field is energized, wherein interrogating the optical fiber comprises detecting changes in the light traveling through the optical fiber;
    determining changes in the magnetic field based on the detected changes in the light traveling through the optical fiber; and
    identifying changes in the magnetic field of the component that generates a magnetic field; wherein the changes in the magnetic field of the component that generates a magnetic field alter the optical properties of the optical fiber as a result of the coating of the optical fiber.

11. The method of claim 10 wherein the material that has optical properties that change with the magnitude of a magnetic field incident on said material comprises a magnetically sensitive material selected from perovskites, $(La,Sr)MnO_3$, $(La,Sr)(Co,Fe)O_3$, $LaTiO_3$, and combinations thereof.

12. The method of claim 10 wherein changes in the light travelling through the fiber are detected using a transmission based detector selected from the group consisting of spectrometer, photodiode, and combinations thereof.

13. The method of claim 12 wherein at least one portion of the electromagnetic component is an exterior portion, and wherein at least one portion of the electromagnetic component is an interior portion.

14. The method of claim 10 wherein the optical fiber does not include a Fiber Bragg Grating.

15. A method for measuring changes in a magnetic field comprising;
    placing an optical fiber inside a magnetic field, wherein the optical fiber is coated with a magnetically sensitive material, wherein the magnetically sensitive material exhibits magnetic field dependent electronic transport behavior;
    interrogating the fiber by detecting changes in the light traveling through the optical fiber using a detector;
    determining changes in the magnetic field based on the detected changes in the light travelling through the optical detector.

16. The method of claim 15 wherein the magnetically sensitive material that has optical properties that change with the magnitude of a magnetic field incident on said material comprises a magnetically sensitive material selected from $La,SrMnO_3$, $(La,Sr)(Co,Fe)O_3$, $LaTiO_3$, and combinations thereof.

17. The method of claim 16 wherein the detector is a transmission based detector selected from the group consisting of spectrometer, photodiode, and combinations thereof.

18. The method of claim 15 wherein the optical fiber does not include a Fiber Bragg Grating.

19. A method for measuring a magnetic field of an electromagnetic component comprising:
    instrumenting one or more portions of a component that generates a magnetic field when energized by placing an optical fiber in electromagnetic communication with one or more portions of said component generating a magnetic field, the optical fiber terminating with a cap comprising a material that has optical properties that change with the magnitude of a magnetic field incident on said material, wherein the material exhibits magnetic field dependent electronic conductivity;
    energizing the component that generates a magnetic field;
    interrogating the optical fiber when the component that generates a magnetic field is energized, wherein interrogating the optical fiber comprises detecting changes in the light traveling through the optical fiber;

determining changes in the magnetic field based on the detected changes in the light traveling through the optical fiber; and identifying changes in the magnetic field of the component that generates a magnetic field; wherein the changes in the magnetic field of the component that generates a magnetic field alter the optical properties of the optical fiber as a result of the coating of the optical fiber.

20. The method of claim 19 wherein the material that has optical properties that change with the magnitude of a magnetic field incident on said material further comprises a magnetically sensitive material selected from perovskites, $(La,Sr)MnO_3$, $(La,Sr)(Co,Fe)O_3$, $LaTiO_3$, and combinations thereof.

21. The method of claim 19 wherein the optical fiber does not include a Fiber Bragg Grating.

22. A method of measuring a magnetic field of an electromagnetic component:

instrumenting one or more portions of an electromagnetic component by placing an optical fiber in electromagnetic communication with the one or more portions of said electromagnetic component, the optical fiber comprising a fiber in optical communication with a magnetically sensitive material selected from the group consisting of perovskites, $(La,Sr)MnO_3$, $(La,Sr)(Co,Fe)O_3$, $LaTiO_3$, and combinations thereof:

energizing the electromagnetic component;

interrogating the optical fiber when the electromagnetic component is energized by detecting changes in intensity, phase, and/or polarization of Rayleigh backscattering in the optical fiber;

determining changes in the magnetic field based on the detected changes in the intensity, phase, and/or polarization of Rayleigh backscattering;

wherein the changes in the magnetic field of the electromagnetic component alter the optical properties of the magnetically sensitive material in contact with the optical fiber;

creating a continuous, spatially resolved distribution of the magnetic field in the instrumented portions of the electromagnetic component.

23. The method of claim 22 wherein the electromagnetic component is a component that generates a magnetic field when energized.

24. The method of claim 22 wherein the magnetically sensitive material comprises a material having a magnetic field dependent electronic conductivity.

25. The method of claim 22 wherein the optical fiber does not include a Fiber Bragg Grating.

* * * * *